US008665187B2

(12) United States Patent
Kishi

(10) Patent No.: US 8,665,187 B2

(45) Date of Patent: Mar. 4, 2014

(54) PIXEL ARRAY SUBSTRATE AND DISPLAY DEVICE

(75) Inventor: Noritaka Kishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 77 days.

(21) Appl. No.: 13/515,784

(22) PCT Filed: Dec. 13, 2010

(86) PCT No.: PCT/JP2010/072395

§ 371 (c)(1), (2), (4) Date: Jun. 13, 2012

(87) PCT Pub. No.: WO2011/074542

PCT Pub. Date: Jun. 23, 2011

(65) Prior Publication Data

US 2012/0248471 A1 Oct. 4, 2012

(30) Foreign Application Priority Data

Dec. 14, 2009 (JP) ................................ 2009-283222

(51) Int. Cl.
*G09G 3/32* (2006.01)
*H01L 33/00* (2010.01)

(52) U.S. Cl.
USPC ........... 345/76; 257/88; 257/E27.121; 345/92

(58) Field of Classification Search
USPC .................. 257/40, 88, E27.121; 345/76, 92
See application file for complete search history.

(56) References Cited

U.S. PATENT DOCUMENTS 7,075,238 B2 * 7/2006 Lee et al. .................. 315/169.1
8,174,466 B2 * 5/2012 Toyomura et al. .............. 345/76
2004/0263501 A1 * 12/2004 Yamashita et al. ............ 345/204
2006/0022907 A1 * 2/2006 Uchino et al. .................. 345/76
2007/0126665 A1 6/2007 Kimura
2008/0231199 A1 * 9/2008 Yamamoto et al. ........ 315/169.3
2009/0046088 A1 * 2/2009 Asano et al. .................. 345/211
2011/0001740 A1 * 1/2011 Jo ................................ 345/211

FOREIGN PATENT DOCUMENTS

JP 2006-215275 A 8/2006
JP 2007-108380 A 4/2007
JP 2007-179042 A 7/2007
JP 2007-316453 A 12/2007

OTHER PUBLICATIONS

International Search Report for PCT Patent Application No. PCT/JP2010/072395, mailed on Jan. 11, 2011, 8 pages (4 pages of English translation and 4 pages of PCT Search Report).

* cited by examiner

*Primary Examiner* — Allan R Wilson
(74) *Attorney, Agent, or Firm* — Morrison & Foerster LLP

(57) ABSTRACT

A pixel array substrate includes: a first through fourth transistors (Ta through Td); a light-emitting element (OEL); a scanning line connected with a control terminal of the fourth transistor; a data line connected with one conducting terminal of the fourth transistor; a first control line (AZi) connected with one conducting terminal of the third transistor; a second control line (Ei) connected with a control terminal of the first transistor; and a first power source line (Ypj) connected with one conducting terminal of the first transistor. One conducting terminal of the second transistor is connected with the first power source line via the first transistor. A control terminal of the second transistor is connected with the data line via the fourth transistor and with a terminal of the light-emitting element via a capacitor (C).

15 Claims, 13 Drawing Sheets

PIXEL ARRAY SUBSTRATE AND DISPLAY DEVICE

CROSS REFERENCE TO RELATED APPLICATIONS

This is a U.S. National Phase patent application of PCT/JP2010/072395, filed Dec. 13, 2010, which claims priority to Japanese Patent Application No. 2009-283222, filed Dec. 14, 2009, each of which is hereby incorporated by reference in the present disclosure in its entirety.

TECHNICAL FIELD

The present invention relates to a pixel array substrate including a light-emitting element (e.g., organic EL element), and a display device including the pixel array substrate.

BACKGROUND ART

Patent Literature 1 discloses a display device including an organic EL element (see FIG. 13). This conventional display device includes control lines DSL, AZL1, AZL2, and WSL, a signal line DTL, and power source lines Vofs, Vss, Vcc, and Vcat. The pixel circuit 10 is provided with an organic EL element 1, five n-channel transistors T1 through T5, and a capacitor C1. A gate terminal of T1 is connected with WSL. A gate terminal of T2 is connected with AZL2. A gate terminal of T3 is connected with DSL. A gate terminal of T4 is connected with AZL1. A gate terminal of T5 (drive transistor) is connected with DTL via T1 and is connected with Vofs via T2. A drain terminal of T5 is connected with Vcc via T3. A source terminal of T5 (i) is connected with an anode of the organic EL element and (ii) is connected with Vss via T4. A capacitor C1 is provided between the gate terminal of T5 and the source terminal of T5. A cathode of the organic EL element is connected with Vcat.

The pixel circuit 10 is configured such that, after an anode potential of the organic EL element 1 is initialized and a threshold of the drive transistor T5 is detected (the threshold is stored between the gate terminal of T5 and the source terminal of T5), a data signal potential is written into the gate terminal of T5 via T1 and an electric current is caused to flow through the organic EL element 1 via T3 and T5 (the organic EL element 1 is caused to emit light). According to the configuration, it is possible to compensate for a resistance increase caused by the threshold of the drive transistor T5 and by deterioration of the organic EL element.

Patent Literature 1 discloses a configuration in which the power source line Vofs connected with T2 is integrated with the control line WSL. Patent Literature 2 discloses a configuration in which a control line AZL2 is integrated with a control line WSL in a previous row. Patent Literature 3 discloses a configuration in which (i) a power source line Vss connected with T4 and a power source line Vofs connected with T2 are integrated with each other and (ii) an electrical potential to be supplied is switched every period.

CITATION LIST

Patent Literature

Patent Literature 1

Japanese Patent Application Publication, Tokukai, No. 2006-215275 A (Publication Date: Aug. 17, 2006)

Patent Literature 2

Japanese Patent Application Publication, Tokukai, No. 2007-316453 A (Publication Date: Dec. 6, 2007)

Patent Literature 3

Japanese Patent Application Publication, Tokukai, No. 2007-108380 A (Publication Date: Apr. 26, 2007)

SUMMARY OF INVENTION

Technical Problem

However, the configuration of the pixel circuit illustrated in FIG. 13 has a problem of having many power source lines (four systems of Vofs, Vss, Vcc, and Vcat are necessary). In addition, at the time of initializing the anode potential of the organic EL element, an electric current path is formed along the following route: the power source line Vcc→T3→T5→T4→the power source line Vss. In a case where transistors operate in a linear region, a large electric current undesirably flows through the electric current path.

An object of the present invention is to realize a pixel array substrate having a small number of power source lines.

Solution to Problem

A pixel array substrate of the present invention includes: a first through fourth transistors; a light-emitting element; a first power source line connected with one conducting terminal of the first transistor; a first control line connected with one conducting terminal of the third transistor; a second control line connected with a control terminal of the first transistor; a scanning line connected with a control terminal of the fourth transistor; and a data line connected with one conducting terminal of the fourth transistor, one conducting terminal of the second transistor being connected with the first power source line via the first transistor, a control terminal of the second transistor being connected with the data line via the fourth transistor and being connected with a terminal of the light-emitting element via a capacitor, the terminal of the light-emitting element, the other conducting terminal of the second transistor, the other conducting terminal of the third transistor, and a control terminal of the third transistor being connected with one another.

The pixel array substrate of the present invention is, for example, driven in the following manner. First, a terminal potential of the light-emitting element is initialized by (i) turning on the first transistor and (ii), while a predetermined electric potential is supplied to the control terminal of the second transistor, turning on the third transistor under a condition which allows no electric current to flow through the light-emitting element. Next, a threshold of the second transistor is detected by (i) turning off the third transistor and (ii) subsequently, while the predetermined electric potential keeps being supplied to the control terminal of the second transistor, turning the second transistor from an on-state to an off-state under a condition which allows no electric current to flow through the light-emitting element. Next, a data signal potential is written from the data line into the control terminal of the second transistor via the fourth transistor after the first transistor is turned off. Subsequently, the first transistor is turned on, so that an electric current is caused to flow from the first power source line to the light-emitting element, via the first transistor and the second transistor (the light-emitting element is caused to emit light).

As describe above, since the third transistor is provided in a diode connection configuration in the pixel array substrate of the present invention, the number of power source lines can be reduced as compared with a conventional configuration (see FIG. 13). This makes it possible to enhance an aperture ratio and reduce a parasitic capacitance between a power source line and wiring (e.g., a data line) which intersects the power source line. In addition, the power source line and the wiring that intersects the power source line are short-circuited less often. This increases yields (productivity). Further, since it is only necessary that a gate terminal and a drain terminal of the same element be short-circuited (connected), arrangement of wiring in a pixel circuit is facilitated and a layout area can be reduced. Further, it becomes possible to reduce external power source circuits which supply a power source potential to the pixel array substrate of the present invention.

Further, with respect to the third transistor, the following equation is met: [a voltage between (i) the conducting terminal connected with the light-emitting element and (ii) the control terminal]=[a voltage between the two conducting terminals]. As such, the third transistor always operates in a saturation region. Therefore, unlike in the conventional configuration (see FIG. 13), a large electric current does not flow at the time of initializing the terminal potential of the light-emitting element. This realizes an electric current limiter function.

Advantageous Effects of Invention

As described above, according to the present invention, it is possible to realize a pixel array substrate having a small number of power source lines.

DESCRIPTION OF EMBODIMENTS

The following description will discuss an embodiment of the present invention with reference to FIGS. 1 through 12.

Embodiment 1

Figure 1:
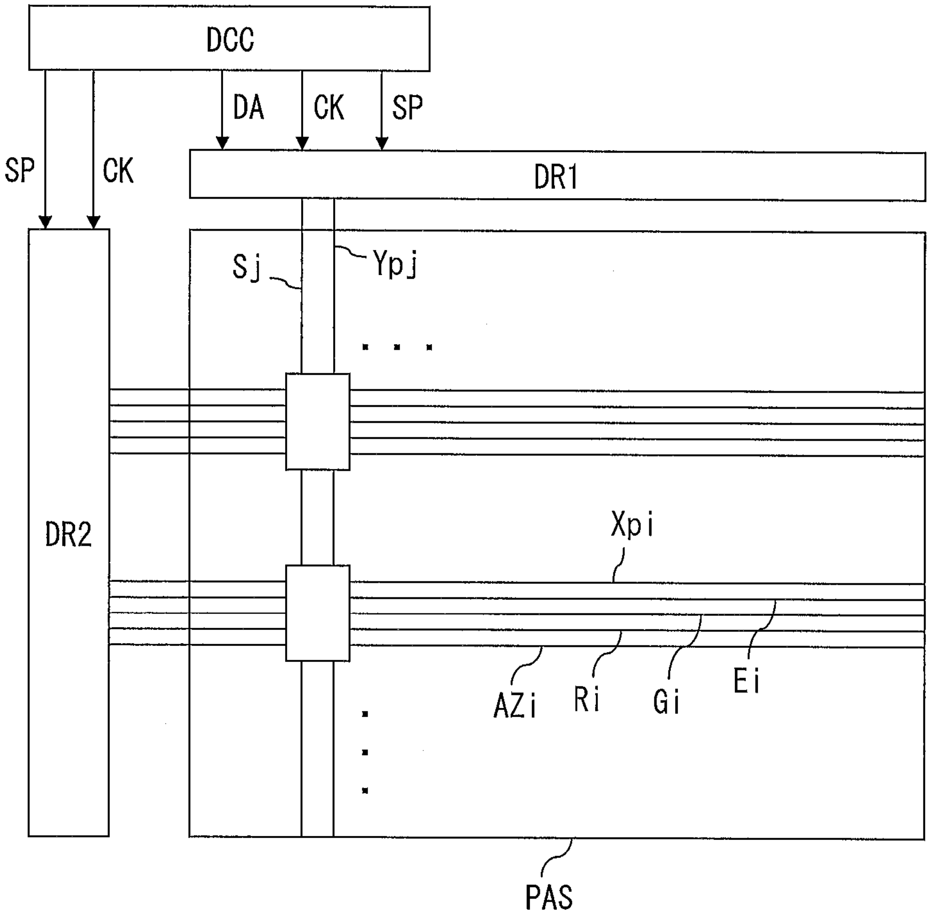
FIG. 1 is a block diagram illustrating a configuration of a display device in accordance with Embodiment 1.

FIG. 1 is a block diagram illustrating a configuration of a display device of the present embodiment. As illustrated in FIG. 1, the display device of the present embodiment includes a pixel array substrate PAS, a display control circuit DCC, a first driver DR1, and a second driver DR2. On the pixel array substrate PAS, (i) a first power source line Ypj and a data line Sj are provided for, for example, a j-th pixel column and (ii) a first control line AZi, a second control line Ei, a scanning line Gi, a third control line Ri, and a second power source line Xpi are provided for, for example, an i-th pixel row. The first driver DR1 drives the first power source line Ypj and the data line Sj on the basis of a clock signal CK and a start pulse SP which are supplied from the display control circuit DCC. The second driver DR2 drives the first control line AZi, the second control line Ei, the scanning line Gi, the third control line Ri, and the second power source line Xpi on the basis of a clock signal CK, video data DA, and a start pulse SP which are supplied from the display control circuit DCC.

Figure 2:
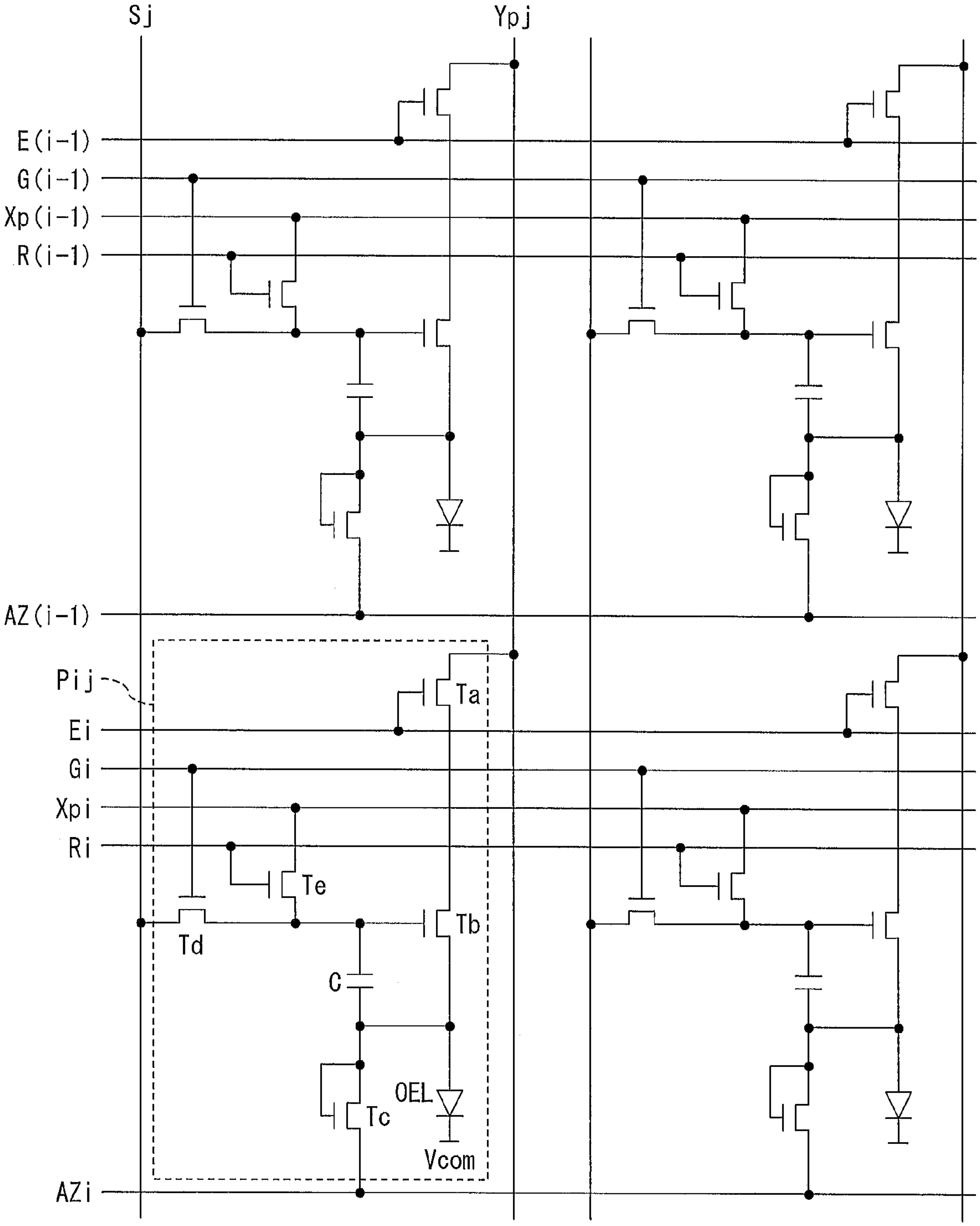
FIG. 2 is a circuit diagram illustrating a partial configuration (4 pixels) of a pixel array in accordance with Embodiment 1.

A partial configuration (four pixel circuits) of a pixel array substrate in accordance with Embodiment 1 is illustrated in FIG. 2. As illustrated in FIG. 2, an organic EL element (organic light-emitting diode, light-emitting element) OEL, five n-channel transistors Ta through Te (first through fifth transistors), and a capacitor C are provided in a pixel circuit Pij belonging to the i-th pixel row and the j-th pixel column.

A gate terminal of Ta is connected with the second control line Ei. A gate terminal of Td is connected with the scanning line Gi. A gate terminal of Te is connected with the third control line Ri. A gate terminal of Tb (drive transistor) is connected with the data line Sj via Td and is connected with the second power source line Xpi via Te. A drain terminal of Tb is connected with the first power source line Ypj via Ta. A drain terminal of Te is connected with the second power source line Xpi. The capacitor C is provided between the gate terminal of Tb and a source terminal of Tb. The source terminal of Tb is connected with an anode of the organic EL element OEL and is connected, via Tc, with the first control line AZi. A cathode of the organic EL element OEL is connected with Vcom. A gate terminal of Tc and a drain terminal of Tc are connected with each other. That is, in a pixel circuit of the present embodiment, (i) the gate terminal of the transistor Tc and the drain terminal of the transistor Tc are connected with the anode of the organic EL element OEL and (ii) a source terminal of the transistor Tc is connected with the first control line AZi.

Figure 3:
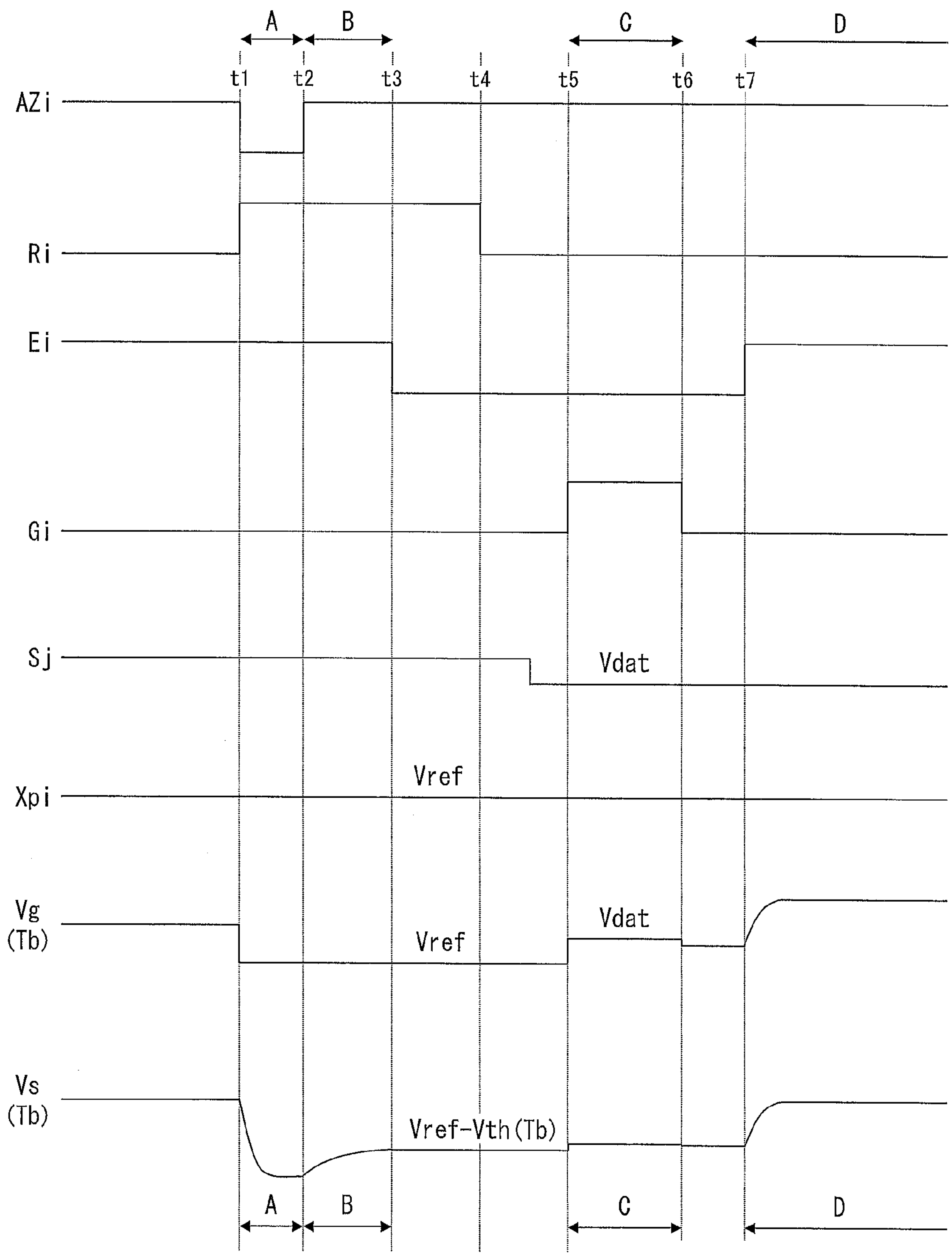
FIG. 3 is a timing chart showing a method for driving the pixel array illustrated in FIG. 2.
Figure 4:
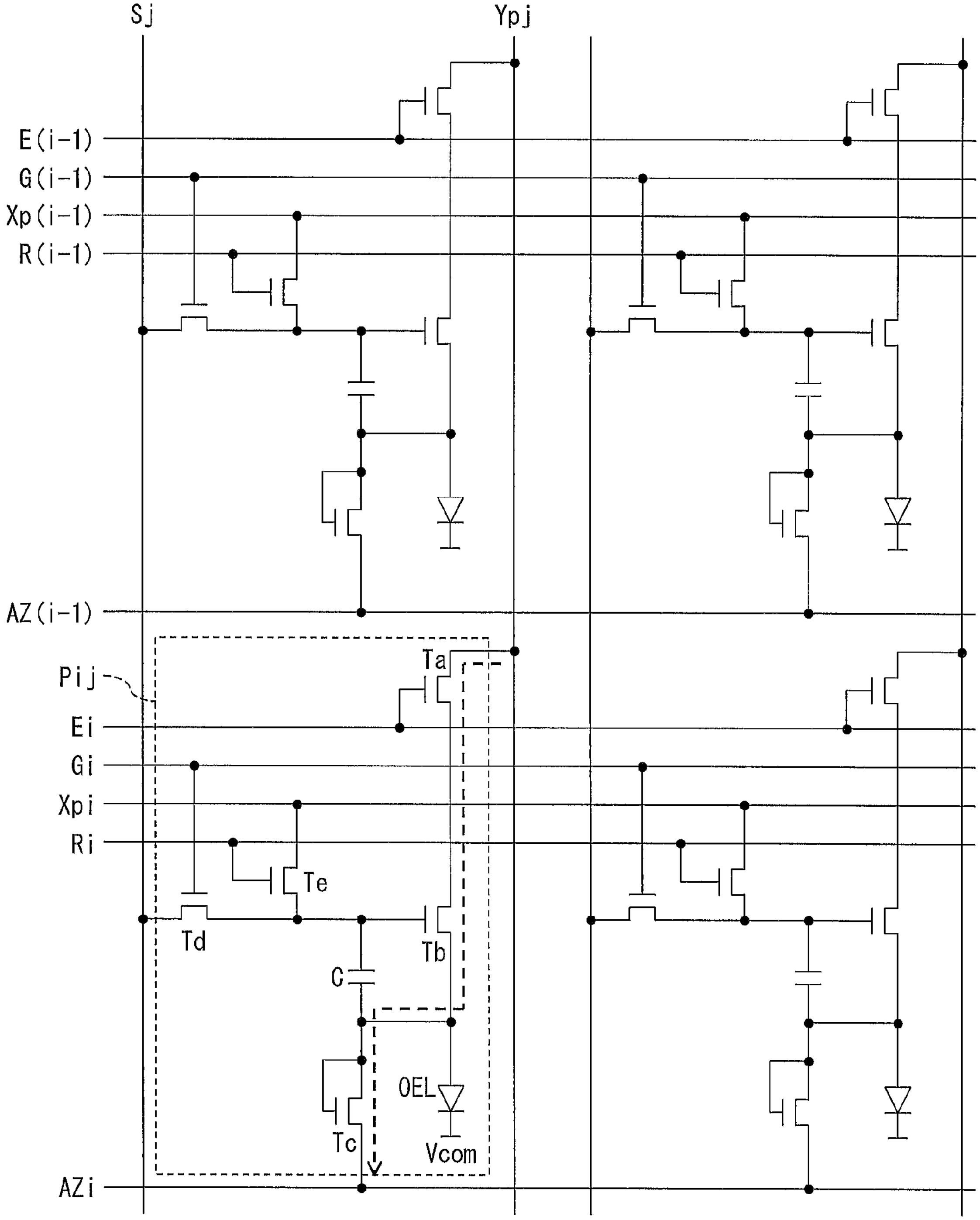
FIG. 4 is a circuit diagram for describing an effect of the pixel array illustrated in FIG. 2.

FIG. 3 shows a method for driving the pixel circuit Pij in the pixel array substrate PAS having the pixel circuits illustrated in FIG. 2. In FIG. 3, (i) AZi represents an electric potential of the first control line AZi, (ii) Ri represents an electric potential of the third control line Ri, (iii) Ei represents an electric potential of the second control line Ei, (iv) Gi represents an electric potential of the scanning line Gi, (v) Sj represents an electric potential of the data line Sj, (vi) Xpi presents an electric potential of the second power source line Xpi, (vii) Vg(Tb) represents a gate potential of the transistor Tb, and (viii) Vs(Tb) represents a source potential of the transistor Tb.

As shown in FIG. 3, at t1, when the electric potential of the second control line Ei is "High", (i) the electric potential of the first control line AZi changes from "High" to "Low" and (ii) the electric potential of the third control line Ri changes from "Low" to "High", so that a period A, in which an anode potential of the organic EL element OEL is reset, begins. In the period A, the transistor Te is in an on-state and the gate potential Vg(Tb) of the transistor (drive transistor) Tb becomes an electric potential of the second power source line Xpi.

Note that Vref, which is an electric potential of the second power source line Xpi, and VL(AZ), which is a "Low" electric potential of the first control line AZi, are set so that the following formulae (1) through (3) are met where Vth(Tb) is a threshold potential of the transistor Tb, Vth(Tc) is a threshold potential of the transistor Tc, and Vth(EL) is a light emission threshold of the organic EL element OEL.

$$VL(AZ)<Vth(EL)-Vth(Tc) \quad (1)$$

$$Vref>Vth(Tb)+VL(AZ)+Vth(Tc) \quad (2)$$

$$Vref<Vth(EL)+Vth(Tb) \quad (3)$$

Therefore, in the period A, an electric current flows from the anode of the organic EL element OEL to the first control line AZi via the transistor Tc, but no electric current flows through the organic EL element OEL according to the Formula (1). Because of this, the anode potential of the organic EL element OEL (which anode potential is equal to the source potential of the transistor Tb) is initialized into VL(AZ)+Vth (Tc). At this time, the transistor Tb is in an on-state according to the Formula (2), but no electric current flows through the organic EL element OEL according to Formula (3). Note that an aspect ratio (W/L ratio) of the transistor Tc is preferably smaller than an aspect ratio (W/L ratio) of the transistor Tb. When the anode potential of the organic EL element OEL is initialized, an electric current flows in the following path: the first power source line Ypj→Ta→Tb→Tc→the first control line AZi. By setting the aspect ratio of Tc to be smaller than the aspect ratio of Tb, it is possible to reduce an electric current that flows through Tb, which has the biggest impact on display quality in a case where differences in characteristic exist (reduce electric current stress on Tb). This makes it possible to reduce changes in the characteristic of Tb.

When the electric potential of the first control line AZi changes from "Low" to "High" at t2, the period A ends and a period B, in which a threshold of the transistor Tb is detected, begins. In the period B, the source potential of the transistor Tc increases so that the transistor Tc is turned off, but no electric current flows through the organic EL element OEL according to the Formula (1). This causes the anode potential of the organic EL element OEL (which anode potential is equal to the source potential of the transistor Tb) to increase. When the source potential Vs(Tb) of the transistor Tb becomes equal to Vref−Vth(Tb), the transistor Tb is turned off. Note that the transistor Tc is preferably an enhancement-type transistor having a positive (higher than a ground potential) threshold, in order that the transistor Tc is reliably turned off in the period B (other than the period A).

When the electric potential of the second control line Ei changes from "High" to "Low" at t3, the period B ends and the transistor Ta is turned off. Subsequently at t4, the electric potential of the third control line Ri changes from "High" to "Low" and the transistor Te is also turned off.

When the electric potential of the scanning line Gi changes from "Low" to "High" at t5, a period C, which is a data writing period, begins. In the period C, a data signal potential Vdat is written, from the data line Sj, into the gate terminal of the transistor Tb, so that Vg(Tb) becomes equal to Vdat. At this time, the following formula is met where Vgs is a voltage between the gate terminal of the transistor Tb and the source terminal of the transistor Tb, Cst is a capacitance between the gate terminal of the transistor Tb and the source terminal of the transistor Tb, and Cel is a capacitance of the organic EL element OEL.

$$Vgs=\{Cel/(Cel+Cst)\}\times(Vdat-Vref)+Vth(Tb)$$

However, since Cel is far larger than Cst, the following formula is met.

$$Vgs=Vdat-Vref+Vth(Tb) \quad (4)$$

Thus, the voltage Vgs between the gate terminal of the transistor Tb and the source terminal of the transistor Tb has a value that is determined in accordance with data.

When the electric potential of the scanning line Gi changes from "High" to "Low" at t6, the period C ends. Subsequently, when the electric potential of the second control line Ei changes from "Low" to "High" at t7, a period D, in which the organic EL element OEL emits light, begins. In the period D, an electric current flows from the first power source line Ypj to the organic EL element OEL via the transistors Ta and Tb, in accordance with Vgs (the voltage between the gate terminal of the transistor Tb and the source terminal of the transistor Tb). At this time, since the gate terminal of the transistor Tb electrically floats, the gate potential of the transistor Tb increases as the source potential of the transistor Tb increases. This allows Vgs to be maintained substantially constant. Note that it is possible to ignore a channel length modulation effect by setting an electric potential of a first power source line Yp so that the transistor Tb operates in a saturation region. A drain current Ib of the transistor Tb can be expressed by the following formula where L is a channel length, W is a channel width, p is electron mobility, and Cox is a capacitance of an oxide.

$$Ib=\{W\times\mu\times Cox\times(Vgs-Vth(Tb))^2\}/(2\times L)$$

From Formula (4), the drain current Ib can be expressed by the following formula.

$$Ib=\{W\times\mu\times Cox\times(Vdat-Vref)^2\}/(2\times L)$$

That is, the drain current Ib (an electric current flowing through the organic EL element OEL) can be set to a value in accordance with Vdat, irrespective of (i) differences in threshold Vth(Tb) among pixel circuits and (ii) a change in Vth(Tb) over time.

Figure 13:
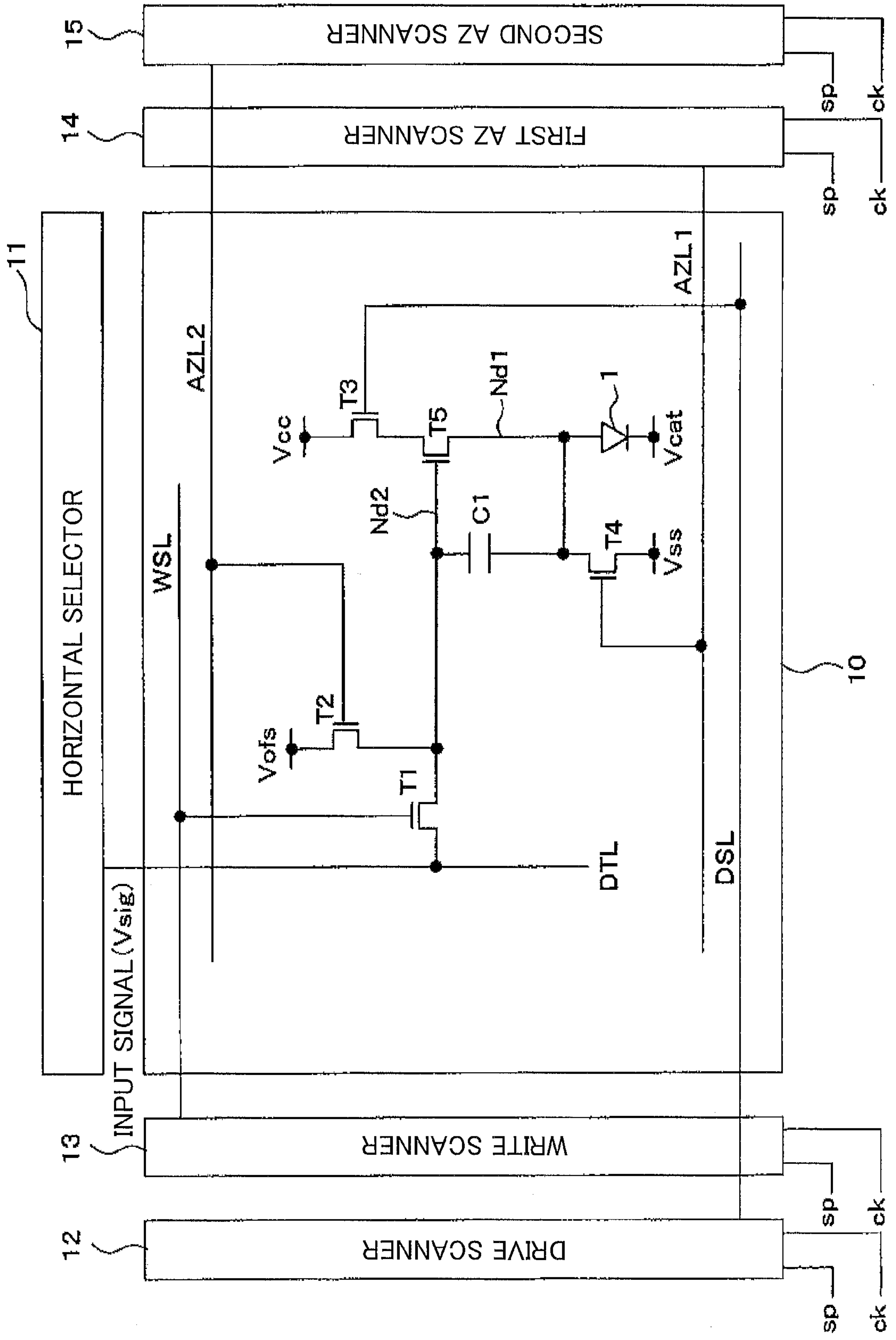
FIG. 13 is a pixel circuit diagram of a conventional display device.

As describe above, since the transistor Tc is provided in a diode connection configuration in the pixel array substrate of the present embodiment, the number of power source lines can be reduced as compared with a conventional configuration (see FIG. 13). This makes it possible to enhance an aperture ratio and reduce a parasitic capacitance between a power source line and wiring (e.g., a data line) which intersects the power source line. In addition, the power source line and the wiring that intersects the power source line are short-circuited less often. This increases yields (productivity). Further, since it is only necessary that a gate terminal and a drain terminal of the same element be short-circuited (connected), arrangement of wiring in a pixel circuit is facilitated and a layout area can be reduced. Further, it becomes possible to reduce external power source circuits which supply a power source potential to the pixel array substrate of the present embodiment.

In addition, an advantageous effect in terms of driving can also be expected as follows. In the period A (the period in which the anode potential of the organic EL element OEL is reset), an electric current path is formed from the first power source line Yp to the first control line AZi, as indicated by the dotted arrow in FIG. 4. At this time, according to the pixel array substrate of the present embodiment, a voltage vgs between the gate terminal of and the source terminal of the transistor Tc is equal to a voltage vds between the drain terminal of and the source terminal of the transistor Tc, so that the transistor Tc always operates in a saturation region. In the saturation region, a drain current Ic of the transistor Tc is limited by the following formula.

$$Ic=\{W\times\mu\times Cox\times(vgs-Vth(Tc))^2\}/(2\times L)$$

As such, a large electric current does not flow unlike in the conventional configuration (see FIG. 13). That is, according to the pixel array substrate of the present embodiment, an electric current limiter function at the time of initializing an anode potential is also achieved.

Embodiment 2

Figure 5:
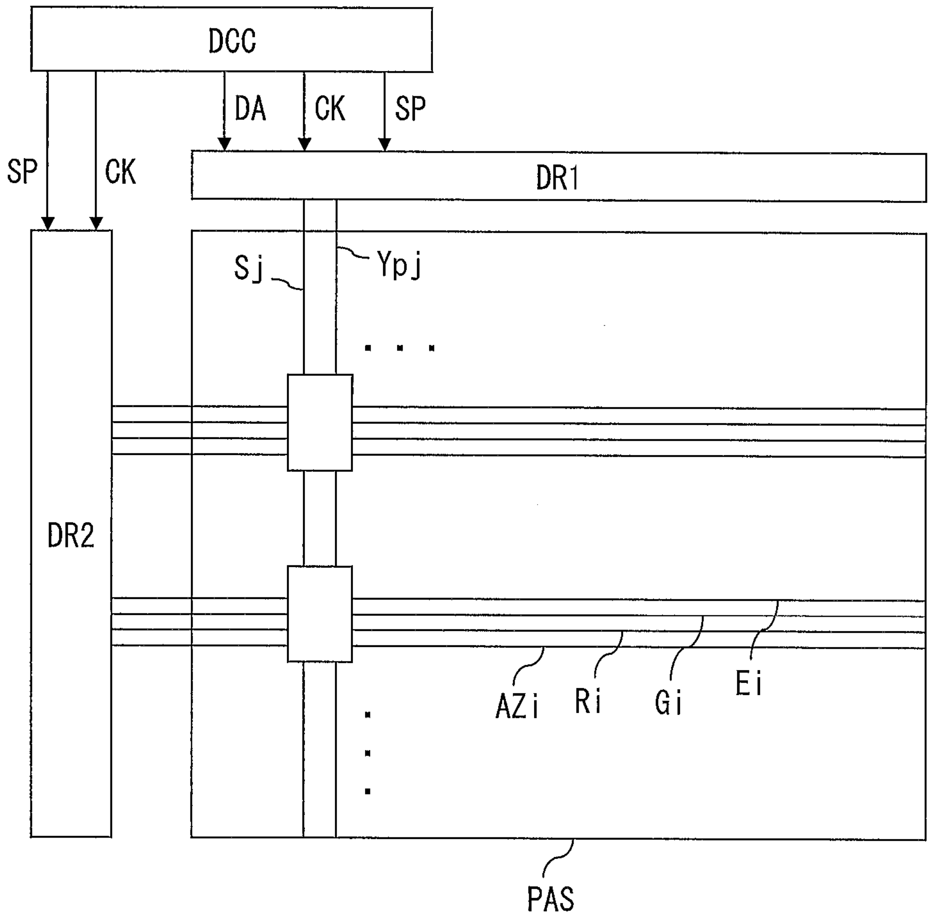
FIG. 5 is a block diagram illustrating a configuration of a display device in accordance with Embodiment 2.

FIG. 5 is a block diagram illustrating a display device of the present embodiment. As illustrated in FIG. 5, the display device of the present embodiment includes a pixel array substrate PAS, a display control circuit DCC, a first driver DR1, and a second driver DR2. On the pixel array substrate PAS, (i) a first power source line Ypj and a data line Sj are provided for, for example, a j-th pixel column and (ii) a first control line AZi, a second control line Ei, a scanning line Gi, and a third control line Ri are provided for, for example, an i-th pixel row. The first driver DR1 drives the first power source line Ypj and the data line Sj on the basis of a clock signal CK and a start pulse SP which are supplied from the display control circuit DCC. The second driver DR2 drives the first control line AZi, the second control line Ei, the scanning line Gi, and the third control line Ri, on the basis of a clock signal CK, video data DA, and a start pulse SP which are supplied from the display control circuit DCC.

Figure 6:
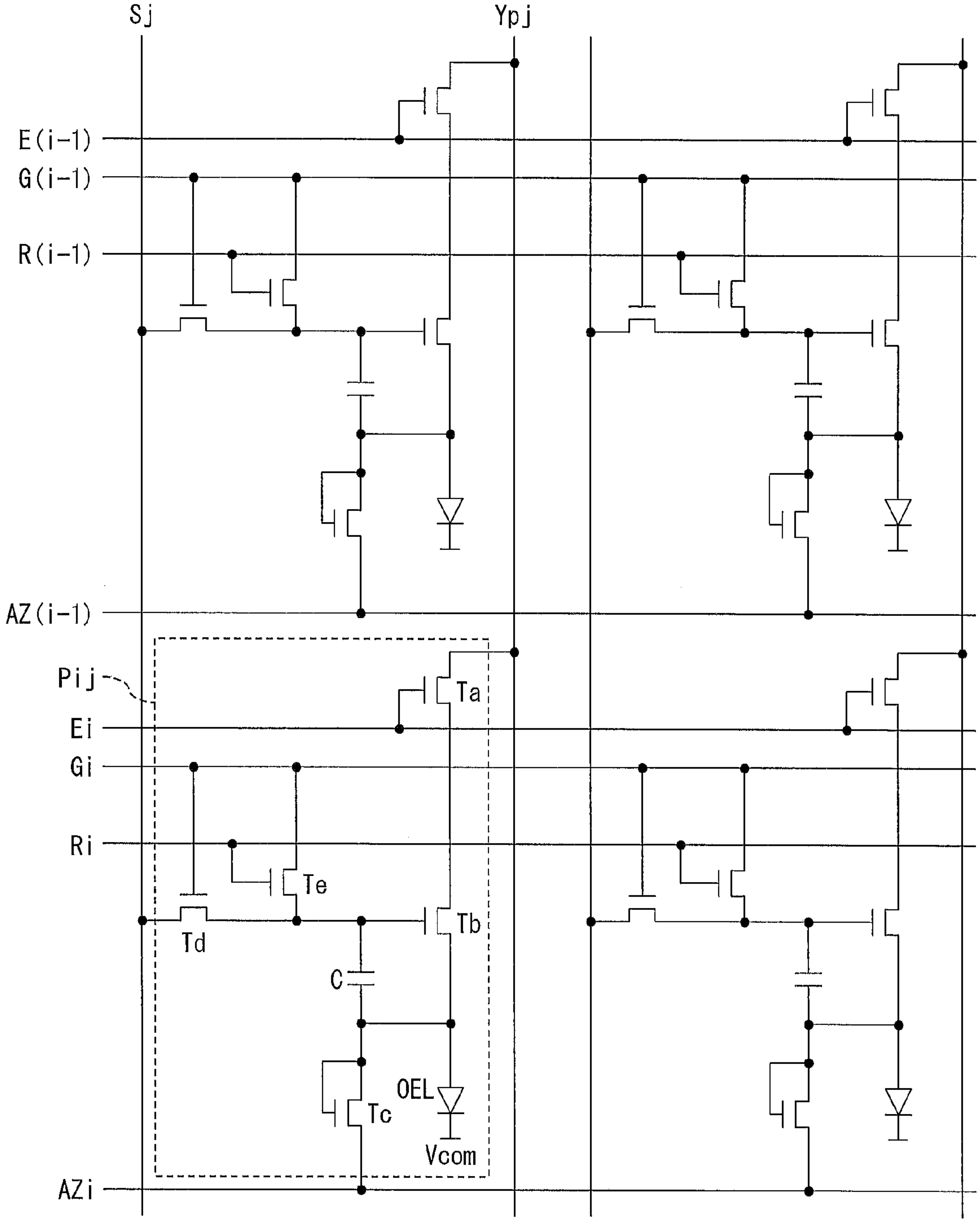
FIG. 6 is a circuit diagram illustrating a partial configuration (four pixels) of a pixel array in accordance with Embodiment 2.

A partial configuration (four pixel circuits) of a pixel array substrate in accordance with Embodiment 2 is illustrated in FIG. 6. As illustrated in FIG. 6, an organic EL element OEL, five n-channel transistors (field-effect transistors) Ta through Te, and a capacitor C are provided in a pixel circuit Pij belonging to the i-th pixel row and the j-th pixel column.

A gate terminal of Ta is connected with the second control line Ei. A gate terminal of Td is connected with the scanning line Gi. A gate terminal of Te is connected with the third control line Ri. A gate terminal of Tb (drive transistor) is connected with the data line Sj via Td and is connected with the second power source line Xpi via Te. A drain terminal of Tb is connected with the first power source line Ypj via Ta. A drain terminal of Te is connected with the scanning line Gi. The capacitor C is provided between the gate terminal of Tb and a source terminal of Tb. The source terminal of Tb is connected with an anode of the organic EL element OEL and is connected, via Tc, with the first control line AZi. A cathode of the organic EL element OEL is connected with Vcom. A gate terminal of Tc and a drain terminal of Tc are connected with each other. That is, in a pixel circuit of the present embodiment, (i) the gate terminal of the transistor Tc and the drain terminal of the transistor Tc are connected with the anode of the organic EL element OEL and (ii) a source terminal of the transistor Tc is connected with the first control line AZi.

Figure 7:
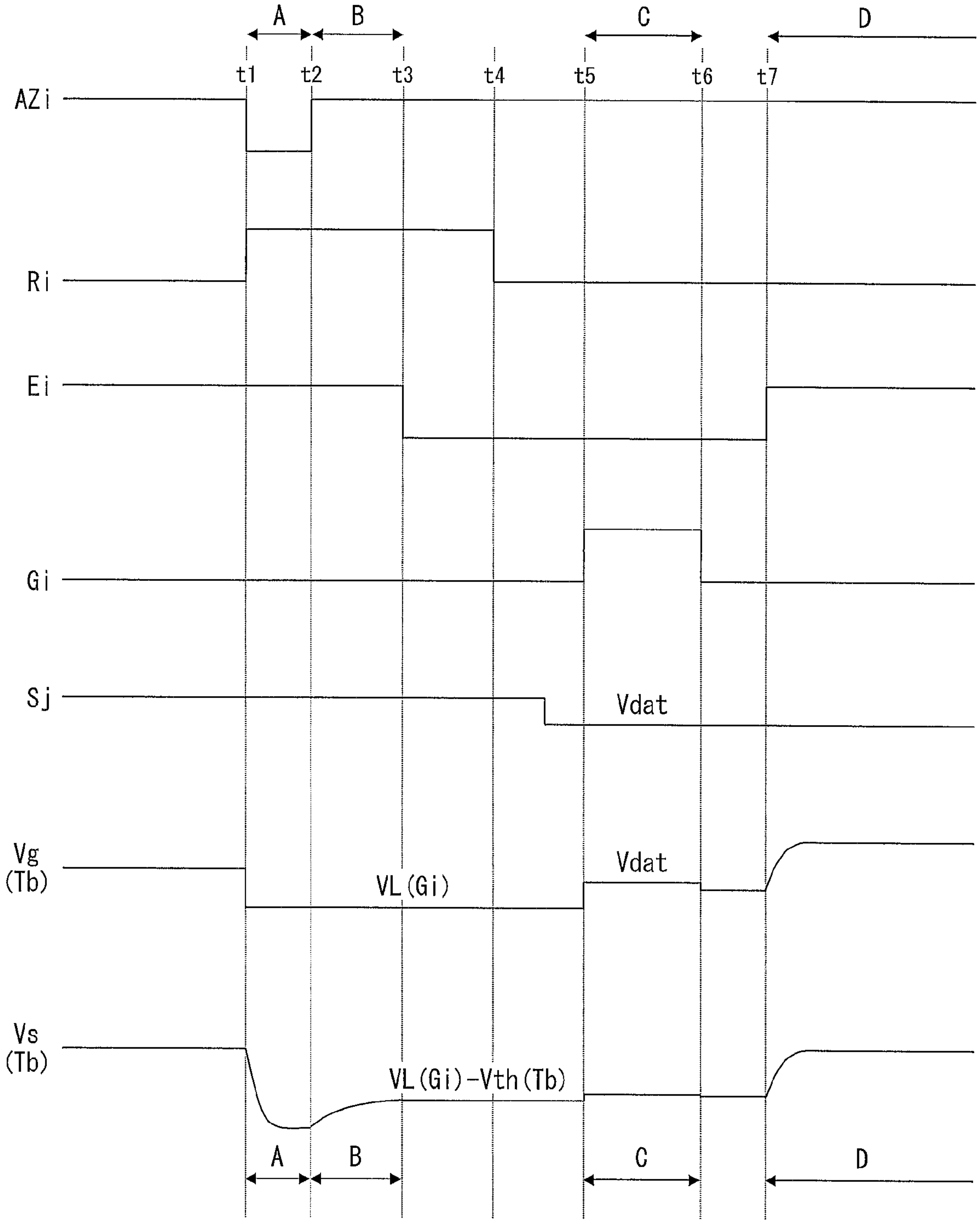
FIG. 7 is a timing chart showing a method for driving the pixel array illustrated in FIG. 6.

FIG. 7 shows a method for driving the pixel circuit Pij in the pixel array substrate PAS having the pixel circuits illustrated in FIG. 6. In FIG. 7, (i) AZi represents an electric potential of the first control line AZi, (ii) Ri represents an electric potential of the third control line Ri, (iii) Ei represents an electric potential of the second control line Ei, (iv) Gi represents an electric potential of the scanning line Gi, (v) Sj represents an electric potential of the data line Sj, (vi) Vg(Tb) represents a gate potential of the transistor Tb, and (vii) Vs(Tb) represents a source potential of the transistor Tb.

FIG. 7 shows the method for driving the pixel circuit Pij in the pixel array substrate PAS having the pixel circuits illustrated in FIG. 6. In FIG. 7, (i) AZi represents the electric potential of the first control line AZi, (ii) Ri represents the electric potential of the third control line Ri, (iii) Ei represents the electric potential of the second control line Ei, (iv) Gi represents the electric potential of the scanning line Gi, (v) Sj represents the electric potential of the data line Sj, (vi) Vg(Tb) represents the gate potential of the transistor Tb, and (vii) Vs(Tb) represents the source potential of the transistor Tb.

The configuration illustrated in FIG. 6 is obtained by integrating the second power source line Xpi and the scanning line Gi which are illustrated in FIG. 2. As such, VL(Gi), which is a "Low (inactive)" electric potential of the scanning line Gi and VL(AZ), which is a "Low" electric potential of the first control line AZi, are set so that the following formulae (5) through (7) are met where Vth(Tb) is a threshold potential of the transistor Tb, Vth(Tc) is a threshold potential of the transistor Tc, and Vth(EL) is a light emission threshold of the organic EL element OEL.

$$VL(AZ)<Vth(EL)-Vth(Tc) \quad (5)$$

$$VL(Gi)>Vth(Tb)+VL(AZ)+Vth(Tc) \quad (6)$$

$$VL(Gi)<Vth(EL)+Vth(Tb) \quad (7)$$

Note that operations in the respective periods A through D are the same as described above with reference to FIG. 3.

The pixel array substrate of Embodiment 2 has a merit of being able to reduce further the number of power source lines, in addition to the merits as described in Embodiment 1. This makes it possible to increase an aperture ratio and reduce a parasitic capacitance between a power source line and wiring (e.g., a data line) which intersects the power source line. In addition, the power source line and the wiring that intersects the power source line are short-circuited less often. This increases yields (productivity). Further, it becomes possible to reduce external power source circuits which supply a power source potential to the pixel array substrate.

Embodiment 3

Figure 8:
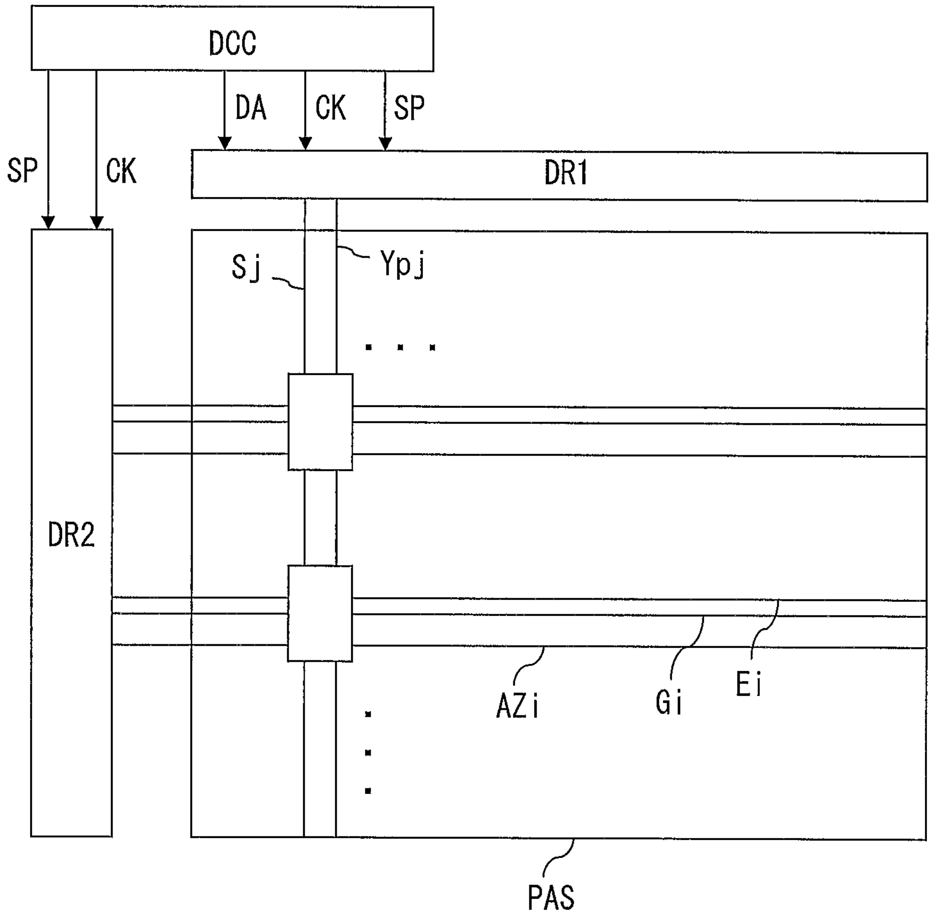
FIG. 8 is a block diagram illustrating a configuration of a display device in accordance with Embodiment 3.

FIG. 8 is a block diagram illustrating a configuration of a display device of the present embodiment. As illustrated in FIG. 8, the display device of the present embodiment includes a pixel array substrate PAS, a display control circuit DCC, a first driver DR1, and a second driver DR2. On the pixel array substrate PAS, (i) a first power source line Ypj and a data line Sj are provided for, for example, a j-th pixel column and (ii) a first control line AZi, a second control line Ei, and a scanning line Gi are provide for, for example, an i-th pixel row. The first driver DR1 drives the first power source line Ypj and the data line Sj on the basis of a clock signal CK and a start pulse SP which are supplied from the display control circuit DCC. The second driver DR2 drives the first control line AZi, the second control line Ei, and the scanning line Gi on the basis of a clock signal CK, video data DA, and a start pulse SP which are supplied from the display control circuit DCC.

Figure 9:
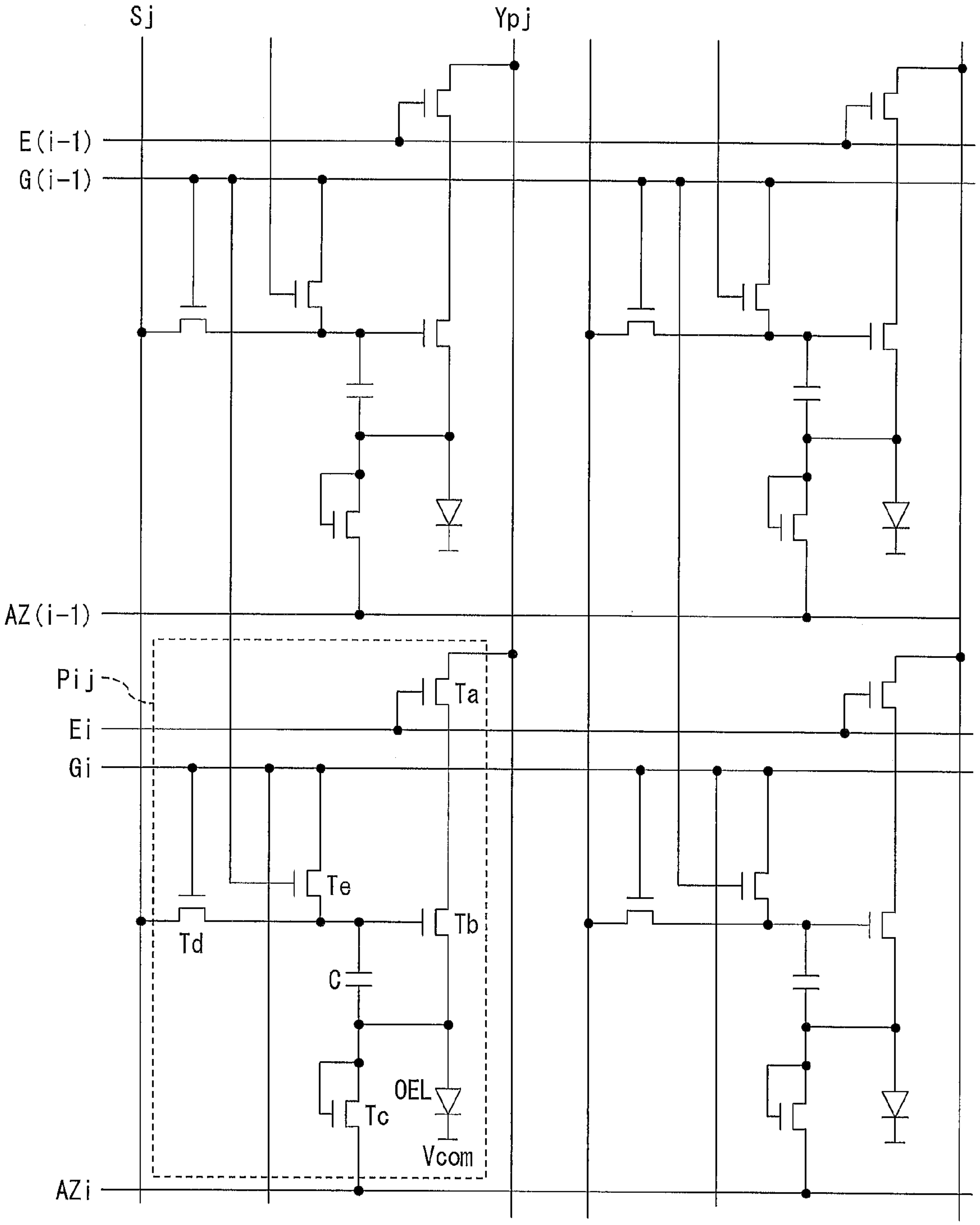
FIG. 9 is a circuit diagram illustrating a partial configuration (four pixels) of a pixel array in accordance with Embodiment 3.

A partial configuration (four pixel circuits) of a pixel array substrate in accordance with Embodiment 3 is illustrated in FIG. 9. As illustrated in FIG. 9, an organic EL element OEL, five n-channel transistors Ta through Te, and a capacitor C are provided in a pixel circuit Pij belonging to the i-th pixel row and the j-th pixel column.

A gate terminal of Ta is connected with the second control line Ei. A gate terminal of Td is connected with the scanning line Gi in the i-th pixel row. A gate terminal of Te is connected with a scanning signal line G(i-1) in the (i-1)-th pixel row. A gate terminal of Tb (drive transistor) is connected with the data line Sj via Td and is connected with the second power source line Xpi via Te. A drain terminal of Tb is connected with the first power source line Ypj via Ta. A drain terminal of Te is connected with the scanning line Gi in the i-th pixel row. The capacitor C is provided between the gate terminal of Tb and a source terminal of Tb. The source terminal of Tb is connected with an anode of the organic EL element OEL and is connected, via Tc, with the first control line AZi. A cathode of the organic EL element OEL is connected with Vcom. A gate terminal of Tc and a drain terminal of Tc are connected with each other. That is, in a pixel circuit of the present embodiment, (i) the gate terminal of the transistor Tc and the drain terminal of the transistor Tc are connected with the anode of the organic EL element OEL and (ii) a source terminal of the transistor Tc is connected with the first control line AZi.

Figure 10:
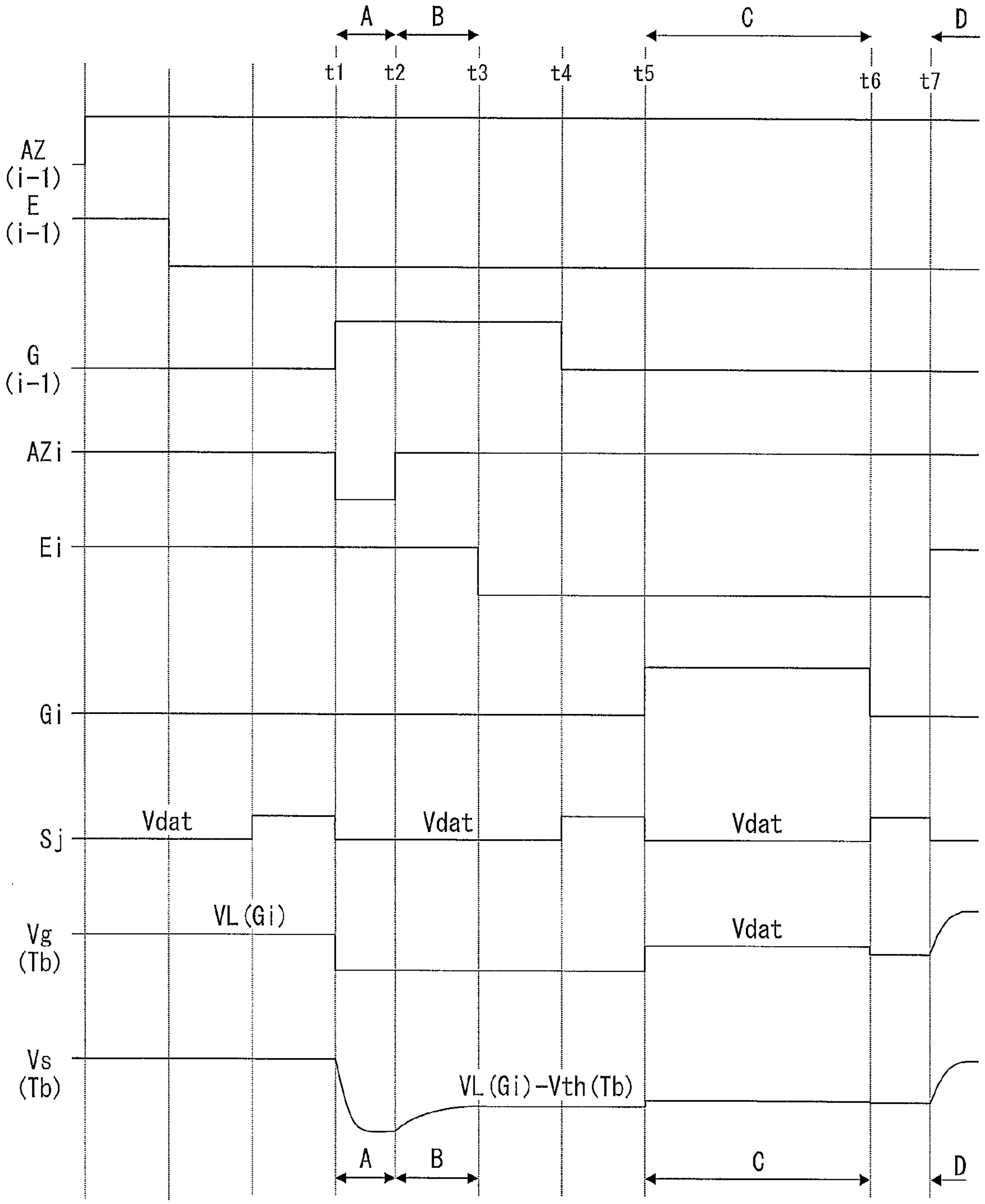
FIG. 10 is a timing chart showing a method for driving a pixel array illustrated in FIG. 9.

FIG. 10 shows a method for driving the pixel circuit Pij in the pixel array substrate PAS having the pixel circuits illustrated in FIG. 9. In FIG. 10, (i) AZ(i-1) represents an electric potential of a first control line AZ(i-1) in the (i-1)-th pixel row, (ii) E(i-1) represents an electric potential of a second control line E(i-1) in the (i-1)-th pixel row, (iii) G(i-1) represents an electric potential of a scanning line G(i-1) in the (i-1)-th pixel row, (iv) AZi represents an electric potential of the first control line AZi in the i-th pixel row, (v) Ei represents an electric potential of the second control line Ei in the i-th pixel row, (vi) Gi represents an electric potential of the scanning line Gi in the i-th pixel row, (vii) Sj represents an electric potential of the data line Sj, (viii) Vg(Tb) represents a gate potential of the transistor Tb, and (ix) Vs(Tb) represents a source potential of the transistor Tb.

As shown in FIG. 10, at t1, when the electric potential of the second control line Ei is "High", (i) the electric potential of the first control line AZi changes from "High" to "Low" and (ii) the electric potential of the scanning line G(i-1) in the (i-1)-th pixel row changes from "Low" to "High", so that a period A, in which an anode potential of the organic EL element OEL is reset, begins. In the period A, the transistor Te is in an on-state and the gate potential Vg(Tb) of the transistor (drive transistor) Tb becomes an electric potential of the second power source line Xpi.

Note that VL(Gi), which is a "Low (inactive)" electric potential of the scanning line Gi, and VL(AZ), which is a "Low" electric potential of the first control line AZi, are set so that the formulae (5) through (7) described in Embodiment 2 are met where Vth(Tb) is a threshold potential of the transistor Tb, Vth(Tc) is a threshold potential of the transistor Tc, and Vth(EL) is a light emission threshold of the organic EL element OEL.

Therefore, in the period A, an electric current flows from the anode of the organic EL element OEL to the first control line AZi via the transistor Tc, but no electric current flows through the organic EL element OEL according to the Formula (5). Because of this, the anode potential of the organic EL element OEL (which anode potential is equal to the source potential of the transistor Tb) is initialized into VL(AZ)+Vth (Tc). At this time, the transistor Tb is in an on-state according to the Formula (6), but no electric current flows through the organic EL element OEL according to Formula (7).

When the electric potential of the first control line AZi changes from "Low" to "High" at t2, the period A ends and a period B, in which a threshold of the transistor Tb is detected, begins. In the period B, the source potential of the transistor Tc increases so that the transistor Tc is turned off, but no electric current flows through the organic EL element OEL according to the Formula (8). This causes the anode potential of the organic EL element OEL (which anode potential is equal to the source potential of the transistor Tb) to increase. When the source potential Vs(Tb) of the transistor Tb becomes equal to Vref−Vth(Tb), the transistor Tb is turned off.

When the electric potential of the second control line Ei changes from "High" to "Low" at t3, the period B ends and the transistor Ta is turned off. Subsequently at t4, the electric potential of the scanning line G(i-1) in the (i-1)-th pixel row changes from "High" to "Low" and the transistor Te is also turned off.

Operations in the respective periods C and D are the same as described above with reference to FIG. 3.

The pixel array substrate of Embodiment 3 has a merit of being able to reduce further the number of control lines, in addition to the merits as described in Embodiment 2. This makes it possible to increase an aperture ratio and reduce a parasitic capacitance between a control line and wiring (e.g., a data line) which intersects the control line. In addition, the control line and the wiring that intersects the control line are short-circuited less often. This increases yields (productivity). Further, it becomes possible to simplify a configuration of the second driver DR2 which drives control lines.

Embodiment 4

Figure 11:
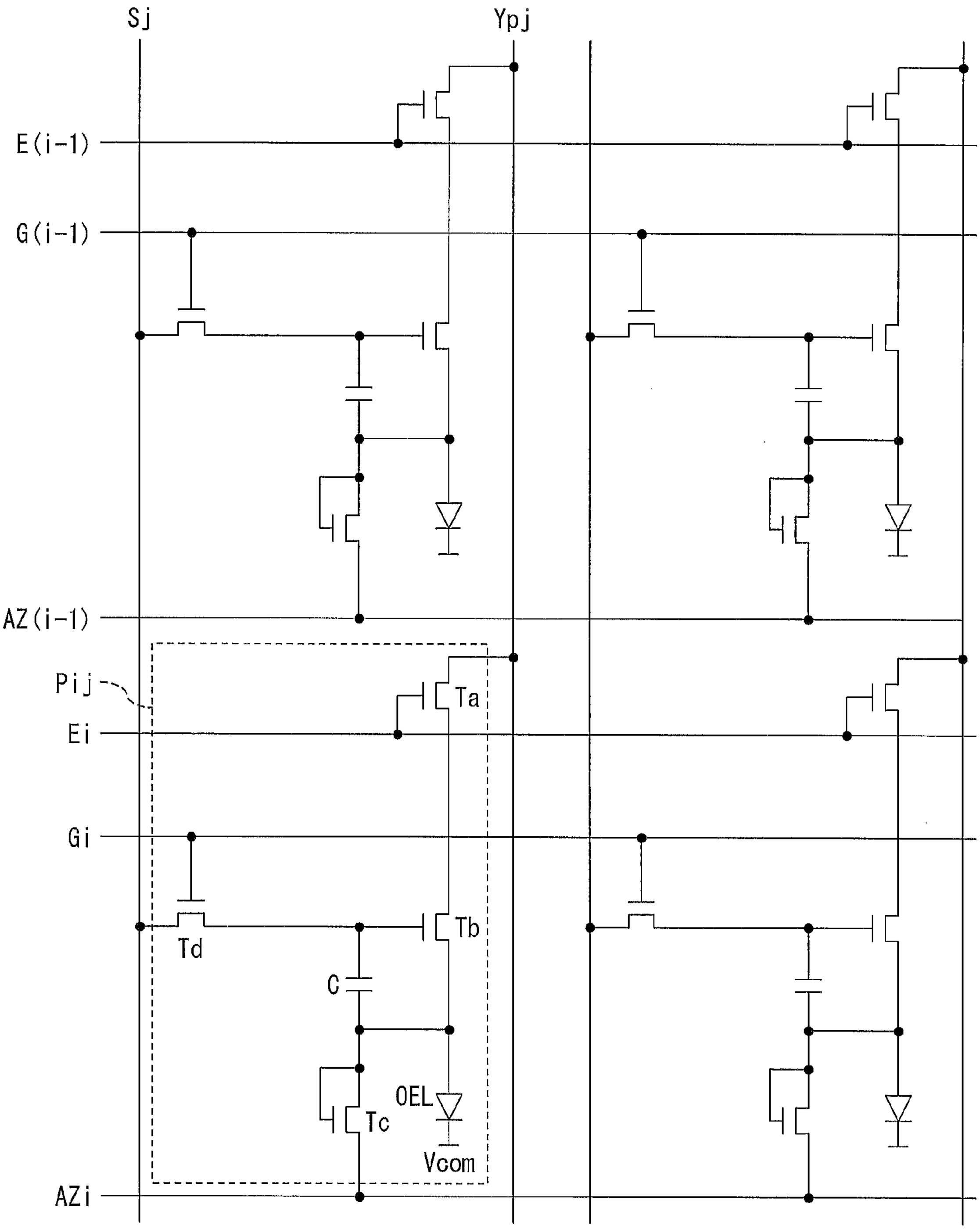
FIG. 11 is a circuit diagram illustrating a partial configuration (four pixels) of a pixel array in accordance with Embodiment 4.

A display device in accordance with Embodiment 4 has the same configuration as the configuration illustrated in FIG. 8. A partial configuration (four pixel circuits) of a pixel array substrate in accordance with Embodiment 4 is illustrated in FIG. 11. As illustrated in FIG. 11, an organic EL element OEL, four n-channel transistors Ta through Td, and a capacitor C are provided in a pixel circuit Pij belonging to the i-th pixel row and the j-th pixel column.

A gate terminal of Ta is connected with the second control line Ei. A gate terminal of Td is connected with the scanning line Gi in the i-th pixel row. A gate terminal of Tb (drive transistor) is connected with the data line Sj via Td. A drain terminal of Tb is connected with the first power source line Ypj via Ta. The capacitor C is provided between the gate terminal of Tb and a source terminal of Tb. The source terminal of Tb is connected with an anode of the organic EL element OEL and is connected, via Tc, with the first control line AZi. A cathode of the organic EL element OEL is connected with Vcom. A gate terminal of Tc and a drain terminal of Tc are connected with each other. That is, in a pixel circuit of the present embodiment, (i) the gate terminal of the transistor Tc and the drain terminal of the transistor Tc are connected with the anode of the organic EL element OEL and (ii) a source terminal of the transistor Tc is connected with the first control line AZi.

Figure 12:
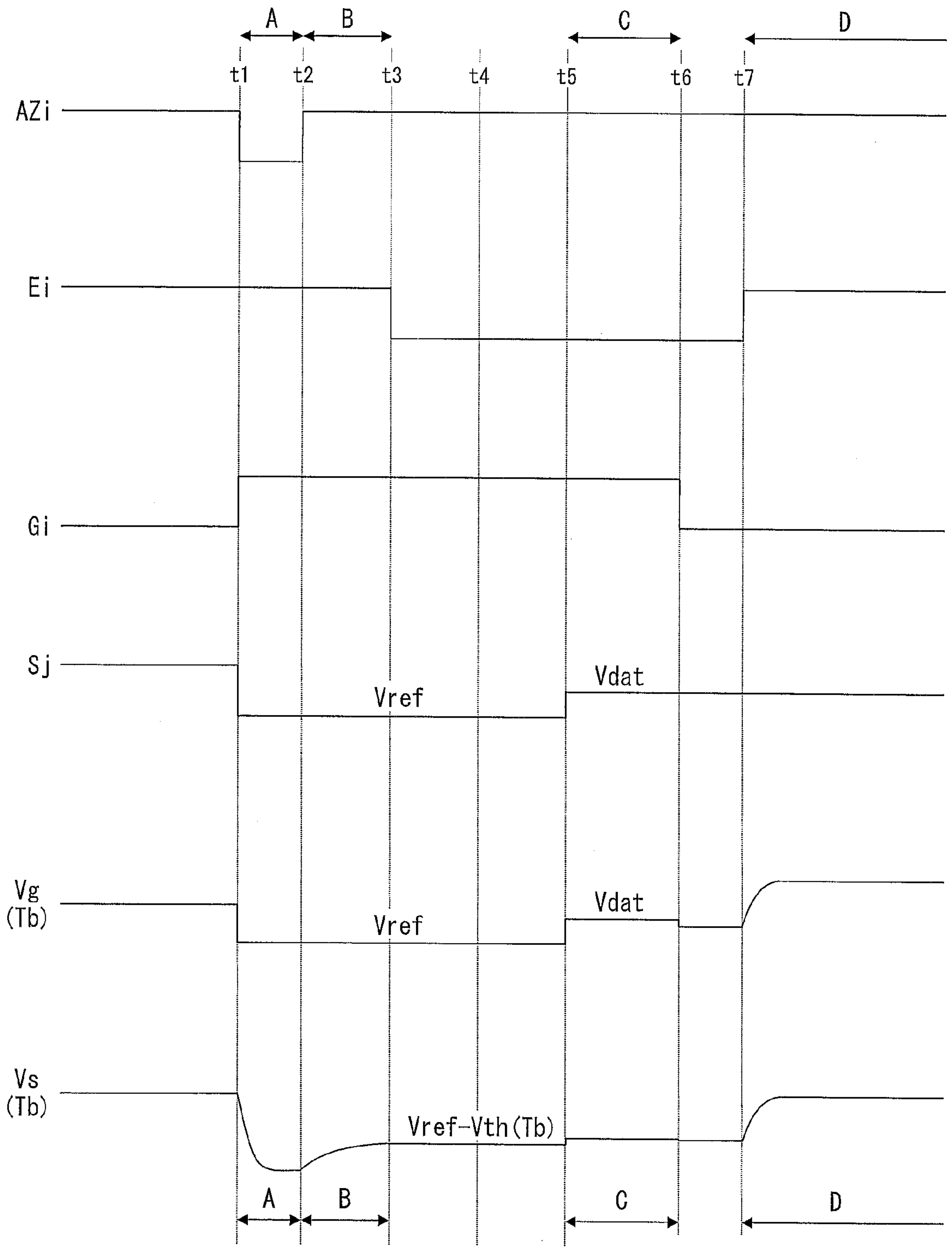
FIG. 12 is a timing chart showing a method for driving a pixel array illustrated in FIG. 11.

FIG. 12 shows a method for driving the pixel circuit Pij in the pixel array substrate PAS having the pixel circuits illustrated in FIG. 11. In FIG. 12, (i) AZi represents an electric potential of the first control line AZi, (ii) Ei represents an electric potential of the second control line Ei, (iii) Gi represents an electric potential of the scanning line Gi, (iv) Sj represents an electric potential of the data line Sj, (v) Vg(Tb) represents a gate potential of the transistor Tb, and (vi) Vs(Tb) represents a source potential of the transistor Tb.

As shown in FIG. 12, at t1, when the electric potential of the second control line Ei is "High", (i) the electric potential of the first control line AZi changes from "High" to "Low" and (ii) the electric potential of the scanning line Gi changes from "Low" to "High", so that a period A, in which an anode potential of the organic EL element OEL is reset, begins. In the period A, a reset potential Vref is supplied to the data line Sj and the gate potential of Vg(Tb) of the transistor (drive transistor) Tb becomes the reset potential Vref.

Note that VL(AZ), which is the reset potential Vref and a "Low" electric potential of the first control line AZi, is set so that the Formulae (1) through (3) described in Embodiment 1 are met.

When the electric potential of the first control line AZi changes from "Low" to "High" at t2, the period A ends and a period B, in which a threshold of the transistor Tb is detected, begins. Note that the electric potential of the scanning line Gi remains "High". In the period B, the source potential of the transistor Tc increases so that the transistor Tc is turned off, but no electric current flows through the organic EL element OEL according to the Formula (1). This causes the anode potential of the organic EL element OEL (which anode potential is equal to the source potential of the transistor Tb) to increase. When the source potential Vs(Tb) of the transistor Tb becomes equal to Vref−Vth(Tb), the transistor Tb is turned off.

When the electric potential of the second control line Ei changes from "High" to "Low" at t3, the period B ends and the transistor Ta is turned off.

At t5, the electric potential of the scanning line Gi remains "High" and a period C, which is a data writing period, begins. In the period C, a data signal potential Vdat is written, from the data line Sj, into the gate terminal of the transistor Tb, so Vg(Tb) becomes equal to Vdat. Note that an operation in the period D is the same as described above with reference to FIG. 3.

The pixel array substrate of Embodiment 4 has a merit of being able to reduce the number of power source lines and the number of control lines, in addition to the merits as described in Embodiment 1. This makes it possible to increase an aperture ratio and reduce a parasitic capacitance between a power source line and wiring (e.g., a data line) which intersects the power source line. In addition, the power source line and the wiring that intersects the power source line are short-circuited less often. This increases yields (productivity). Similarly, it becomes possible to reduce a parasitic capacitance between a control line and wiring (e.g., a data line) which intersects the control line. In addition, the control line and the wiring that intersects the control line are short-circuited less often. This increases yields (productivity). Further, it becomes possible to simplify a configuration of the second driver DR2 which drives power source lines and control lines. Therefore, the pixel array substrate of Embodiment 4 is suitable for a small-sized high-resolution display.

The present invention is not limited to the above-described embodiments. An embodiment obtained by appropriately modifying the embodiments on the basis of common technical knowledge and an embodiment obtained by combining modified embodiments will also be included in the embodiments of the present invention.

A pixel array substrate of the present invention includes: a first through fourth transistors; a light-emitting element; a first power source line connected with one conducting terminal of the first transistor; a first control line connected with one conducting terminal of the third transistor; a second control line connected with a control terminal of the first transistor; a scanning line connected with a control terminal of the fourth transistor; and a data line connected with one conducting terminal of the fourth transistor, one conducting terminal of the second transistor being connected with the first power source line via the first transistor, a control terminal of the second transistor being connected with the data line via the fourth transistor and being connected with a terminal of the light-emitting element via a capacitor, the terminal of the light-emitting element, the other conducting terminal of the second transistor, the other conducting terminal of the third transistor, and a control terminal of the third transistor being connected with one another.

The pixel array substrate of the present invention is, for example, driven in the following manner. First, a terminal potential of the light-emitting element is initialized by (i) turning on the first transistor and (ii), while a predetermined electric potential is supplied to the control terminal of the second transistor, turning on the third transistor under a condition which allows no electric current to flow through the light-emitting element. Next, a threshold of the second transistor is detected by (i) turning off the third transistor and (ii) subsequently, while the predetermined electric potential keeps being supplied to the control terminal of the second transistor, turning the second transistor from an on-state to an off-state under a condition which allows no electric current to flow through the light-emitting element. Next, a data signal potential is written from the data line into the control terminal of the second transistor via the fourth transistor after the first transistor is turned off. Subsequently, the first transistor is turned on, so that an electric current is caused to flow from the first power source line to the light-emitting element, via the first transistor and the second transistor (the light-emitting element is caused to emit light).

As describe above, since the third transistor is provided in a diode connection configuration in the pixel array substrate of the present invention, the number of power source lines can be reduced as compared with a conventional configuration (see FIG. 13). This makes it possible to enhance an aperture ratio and reduce a parasitic capacitance between a power source line and wiring (e.g., a data line) which intersects the power source line. In addition, the power source line and the wiring that intersects the power source line are short-circuited less often. This increases yields (productivity). Further, since it is only necessary that a gate terminal and a drain terminal of the same element be short-circuited (connected), arrangement of wiring in a pixel circuit is facilitated and a layout area can be reduced. Further, it becomes possible to reduce external power source circuits which supply a power source potential to the pixel array substrate of the present invention.

Further, with respect to the third transistor, the following equation is met: [a voltage between (i) the conducting terminal connected with the light-emitting element and (ii) the control terminal connected with the light-emitting element] =[a voltage between the two conducting terminals]. As such, the third transistor always operates in a saturation region. Therefore, unlike in the conventional configuration (see FIG. 13), a large electric current does not flow at the time of initializing the terminal potential of the light-emitting element. This realizes an electric current limiter function.

The pixel array substrate of the present invention can have a configuration in which each of the first through fourth transistors is an n-channel field-effect transistor.

The pixel array substrate of the present invention can have a configuration in which the third transistor is an enhancement-type field-effect transistor having a threshold higher than a ground potential.

The pixel array substrate of the present invention can further include a fifth transistor having one conducting terminal thereof connected with the control terminal of the second transistor.

The pixel array substrate of the present invention can further include: a second power source line connected with the other conducting terminal of the fifth transistor; and a third control line connected with a control terminal of the fifth transistor.

The pixel array substrate of the present invention can further include a third control line connected with a control terminal of the fifth transistor, the other conducting terminal of the fifth transistor being connected with the scanning line.

The pixel array substrate of the present invention can have a configuration in which the other conducting terminal of the fifth transistor is connected with the scanning line and a control terminal of the fifth transistor is connected with another scanning line in a preceding stage.

The pixel array substrate of the present invention can have a configuration in which the light-emitting element is an organic light-emitting diode.

The pixel array substrate of the present invention can have a configuration in which the third transistor has an aspect ratio smaller than that of the second transistor.

A display device of the present invention includes the pixel array substrate.

The display device of the present invention can have a configuration in which a terminal potential of the light-emitting element is initialized by (i) turning on the first transistor and (ii), while a predetermined electric potential is supplied to the control terminal of the second transistor, turning on the third transistor under a condition which allows no electric current to flow through the light-emitting element.

The display device of the present invention can have a configuration in which the third transistor is always in an off-state except in a period in which the terminal potential of the light-emitting element is initialized.

The display device of the present invention can have a configuration in which a threshold of the second transistor is detected by (i) initializing the terminal potential of the light-emitting element and turning off the third transistor and (ii) subsequently, while the predetermined electric potential keeps being supplied to the control terminal of the second transistor, turning the second transistor from an on-state to an off-state under a condition which allows no electric current to flow through the light-emitting element.

The display device of the present invention can have a configuration in which a data signal potential is written from the data line into the control terminal of the second transistor via the fourth transistor, after (i) the threshold of the second transistor is detected and (ii) the first transistor is turned off.

The display device of the present invention can have a configuration in which, after the data signal potential is written into the control terminal of the second transistor, the first transistor is turned on, so that an electric current is caused to flow from the first power source line to the light-emitting element, via the first transistor and the second transistor.

INDUSTRIAL APPLICABILITY

The pixel array substrate of the present invention and the display device of the present invention is suitable, for example, for an organic EL display.

REFERENCE SIGNS LIST

OEL: organic EL element (organic light-emitting diode)
Ta through Te: transistors (first through fifth transistors)
C: capacitor
Gi: scanning line
Sj: data line
Ypj: first power source line
Xpi: second power source line
AZi: first control line
Ei: second control line
Ri: third control line

The invention claimed is:

1. A pixel array substrate comprising:
- a first through fourth transistors;
- a light-emitting element;
- a first power source line connected with one conducting terminal of the first transistor;
- a first control line connected with one conducting terminal of the third transistor;
- a second control line connected with a control terminal of the first transistor;
- a scanning line connected with a control terminal of the fourth transistor; and
- a data line connected with one conducting terminal of the fourth transistor,
- one conducting terminal of the second transistor being connected with the first power source line via the first transistor,
- a control terminal of the second transistor being connected with the data line via the fourth transistor and being connected with a terminal of the light-emitting element via a capacitor,
- the terminal of the light-emitting element, the other conducting terminal of the second transistor, the other conducting terminal of the third transistor, and a control terminal of the third transistor being connected with one another.

2. The pixel array substrate as set forth in claim 1, wherein each of the first through fourth transistors is an n-channel field-effect transistor.

3. The pixel array substrate as set forth in claim 1, wherein the third transistor is an enhancement-type field-effect transistor having a threshold higher than a ground potential.

4. A pixel array substrate as set forth in claim 1, further comprising a fifth transistor having one conducting terminal thereof connected with the control terminal of the second transistor.

5. A pixel array substrate as set forth in claim 4, further comprising:
- a second power source line connected with the other conducting terminal of the fifth transistor; and
- a third control line connected with a control terminal of the fifth transistor.

6. A pixel array substrate as set forth in claim 4, further comprising a third control line connected with a control terminal of the fifth transistor,
- the other conducting terminal of the fifth transistor being connected with the scanning line.

7. The pixel array substrate as set forth in claim 4, wherein the other conducting terminal of the fifth transistor is connected with the scanning line and a control terminal of the fifth transistor is connected with another scanning line in a preceding stage.

8. The pixel array substrate as set forth in claim 1, wherein the third transistor has an aspect ratio smaller than that of the second transistor.

9. The pixel array substrate as set forth in any one of claim 1, wherein the light-emitting element is an organic light-emitting diode.

10. A display device comprising a pixel array substrate recited in claim 1.

11. The display device as set forth in claim 10, wherein a terminal potential of the light-emitting element is initialized by (i) turning on the first transistor and (ii), while a predetermined electric potential is supplied to the control terminal of the second transistor, turning on the third transistor under a condition which allows no electric current to flow through the light-emitting element.

12. The display device as set forth in claim 11, wherein the third transistor is always in an off-state except in a period in which the terminal potential of the light-emitting element is initialized.

13. The display device as set forth in claim 12, wherein a threshold of the second transistor is detected by (i) initializing the terminal potential of the light-emitting element and turning off the third transistor and (ii) subsequently, while the predetermined electric potential keeps being supplied to the control terminal of the second transistor, turning the second transistor from an on-state to an off-state under a condition which allows no electric current to flow through the light-emitting element.

14. The display device as set forth in claim 13, wherein a data signal potential is written from the data line into the control terminal of the second transistor via the fourth transistor, after (i) the threshold of the second transistor is detected and (ii) the first transistor is turned off.

15. The display device as set forth in claim 14, wherein, after the data signal potential is written into the control terminal of the second transistor, the first transistor is turned on, so that an electric current is caused to flow from the first power source line to the light-emitting element, via the first transistor and the second transistor.

* * * * *